(12) United States Patent
Park

(10) Patent No.: US 6,228,762 B1
(45) Date of Patent: May 8, 2001

(54) METHODS FOR FORMING CONTACT HOLES HAVING SIDEWALLS WITH SMOOTH PROFILES

(75) Inventor: Young-Woo Park, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/231,339

(22) Filed: Jan. 13, 1999

(30) Foreign Application Priority Data

Jan. 15, 1998 (KR) ........................................................ 98-981

(51) Int. Cl.⁷ ...................... H01L 21/4763; H01L 21/311
(52) U.S. Cl. ............................ 438/639; 438/637; 438/696
(58) Field of Search ...................................... 438/639, 696

(56) References Cited

U.S. PATENT DOCUMENTS 5,500,080 * 3/1996 Choi ................................... 156/644.1
5,576,242 * 11/1996 Liu ........................................ 437/191
5,930,668 * 7/1999 Gardner ................................ 438/624

* cited by examiner

Primary Examiner—Charles Bowers
Assistant Examiner—Nema Berezny
(74) Attorney, Agent, or Firm—Myers Bigel Sibley & Sajovec

(57) ABSTRACT

A method for forming an electronic device includes the steps of forming a first insulating layer on a substrate, forming a patterned conductive layer on the first insulating layer, and forming a second insulating layer on the first insulating layer and on the patterned conductive layer. A contact hole is formed through the first and second insulating layers exposing a portion of the substrate and a portion of the patterned conductive layer so that sidewalls of the contact hole including the exposed portion of the patterned conductive layer have a smooth profile through the first and second insulating layers. An insulating spacer is then formed on the contact hole sidewalls having the smooth profile.

24 Claims, 7 Drawing Sheets

METHODS FOR FORMING CONTACT HOLES HAVING SIDEWALLS WITH SMOOTH PROFILES

FIELD OF THE INVENTION

The present invention relates to the field of electronics and more particularly to methods of forming contact holes for electronic devices and related structures.

Background of the Invention

FIG. 1 is a cross-sectional view showing a storage node contact of an ideal semiconductor memory device.

Referring to FIG. 1, a storage node contact of an ideal semiconductor memory device is described as having a storage node contact hole 20a which is formed so as not to expose a bit line 18 within insulating layer 16b. In detail, a device isolation layer 12 is formed to define active and inactive regions on a semiconductor substrate 10. The device isolation layer 12 can be a shallow trench isolation layer. A contact pad 14 is formed to be electrically connected to the active region of the semiconductor substrate 10. First and second insulating layers 16a and 16b are sequentially formed over the semiconductor substrate 10, including the contact pad 14. A bit line 18 is located between the first and second insulating layers 16a and 16b.

The second and first insulating layers 16b and 16a are sequentially etched to form a storage node contact hole 20a which exposes a portion of the contact pad 14. An insulating spacer 22a is formed on sidewalls of the storage node contact hole 20a. A storage node 24 is formed by filling the storage node contact hole 20a with a conductive layer such as a layer of polysilicon.

FIGS. 2 and 3 are cross-sectional views showing storage node contacts of a conventional semiconductor memory device.

Referring to FIG. 2, portions of the bit lines 18 on both sides of the contact hole 20b may be exposed if the size of the storage node contact hole 20b increases due to overexposure or overetching when forming the storage node contact hole. If an insulating spacer 22b and then a storage node 24 are formed as shown in FIG. 2, a short circuit between the exposed portion of the bit line 18 and the storage node 24 may result (reference number 25).

Referring to FIG. 3, a portion of the bit line 18 on one sidewall of the contact hole 20c may be exposed due to misalignment when the storage node contact hole 20c is formed. If an insulating spacer 22c and then a storage node 24 are formed as shown in FIG. 3, a short-circuit between the exposed portion of the bit line 18 and the storage node 24 may be generated (reference number 25).

The above-mentioned short-circuit conditions resulting from the exposed portions of the bit line 18 may become a severe problem as more highly integrated DRAMS are developed. In particular, problems related to the short-circuit conditions discussed above may become more severe as design rules of less than 0.25 $\mu$m are developed and used.

SUMMARY OF THE INVENTION

It is therefore an object of the present invention to provide improved methods of forming contact holes.

It is another object of the present invention to provide methods for forming semiconductor memory devices capable of reducing short-circuits between bit lines and storage node electrodes when forming storage node contacts.

These and other objects are provided according to the present invention by forming a first insulating layer on a substrate, forming a patterned conductive layer on the first insulating layer, and forming a second insulating layer on the first insulating layer and on the conductive line. A contact hole is formed through the first and second insulating layers exposing a portion of the substrate and/or a portion of the conductive layer so that sidewalls of the contact hole have a smooth profile through the first and second insulating layers. An insulating spacer is then formed on the contact hole sidewalls having the smooth profile, and a conductive via can then be formed filling the contact hole. By providing the smooth profile, the insulating spacer can more effectively separate the patterned conductive layer and other conductive layers so that short-circuits therebetween can be reduced.

In particular, the step of forming the patterned conductive layer can include forming a polysilicon layer on the first insulating layer, forming a tungsten silicide layer on the polysilicon layer, and forming an anti-reflective coating (ARC) layer on the tungsten silicide layer. In addition, the step of forming the insulating spacer can be preceded by annealing the first and second insulating layers and the patterned conductive layer at a temperature in the range of 400° C. to 800° C. The anneal can reduce projections into the contact hole resulting from reactions at the interface between the anti-reflective coating layer and the tungsten silicide layer. The anti-reflective coating (ARC) layer can be a layer of a material such as silicon nitride (SiN) or silicon oxynitride (SiON).

Moreover, the methods of the present invention can be used to provide storage node contact holes for Dynamic Random Access Memory (DRAM) devices. In particular, the patterned conductive layer can be a bit line. In addition, a conductive via can be formed in the contact hole, a first capacitor electrode can be formed on the conductive via opposite the substrate, a capacitor dielectric layer can be formed on the first capacitor electrode opposite the substrate, and a second capacitor electrode can be formed on the capacitor dielectric layer opposite the first capacitor electrode.

According to a particular aspect of the invention, the step of forming the contact hole can include forming a preliminary contact hole through the first and second insulating layers wherein a surface portion of the patterned conductive layer opposite the substrate and a sidewall of the patterned conductive layer are exposed by the preliminary contact hole so that a step is formed in a sidewall of the preliminary contact hole. In addition, the exposed portions of the patterned conductive layer can be etched to reduce the step thereby providing the contact hole sidewalls having the smooth profile.

DETAILED DESCRIPTION

Figure 1:
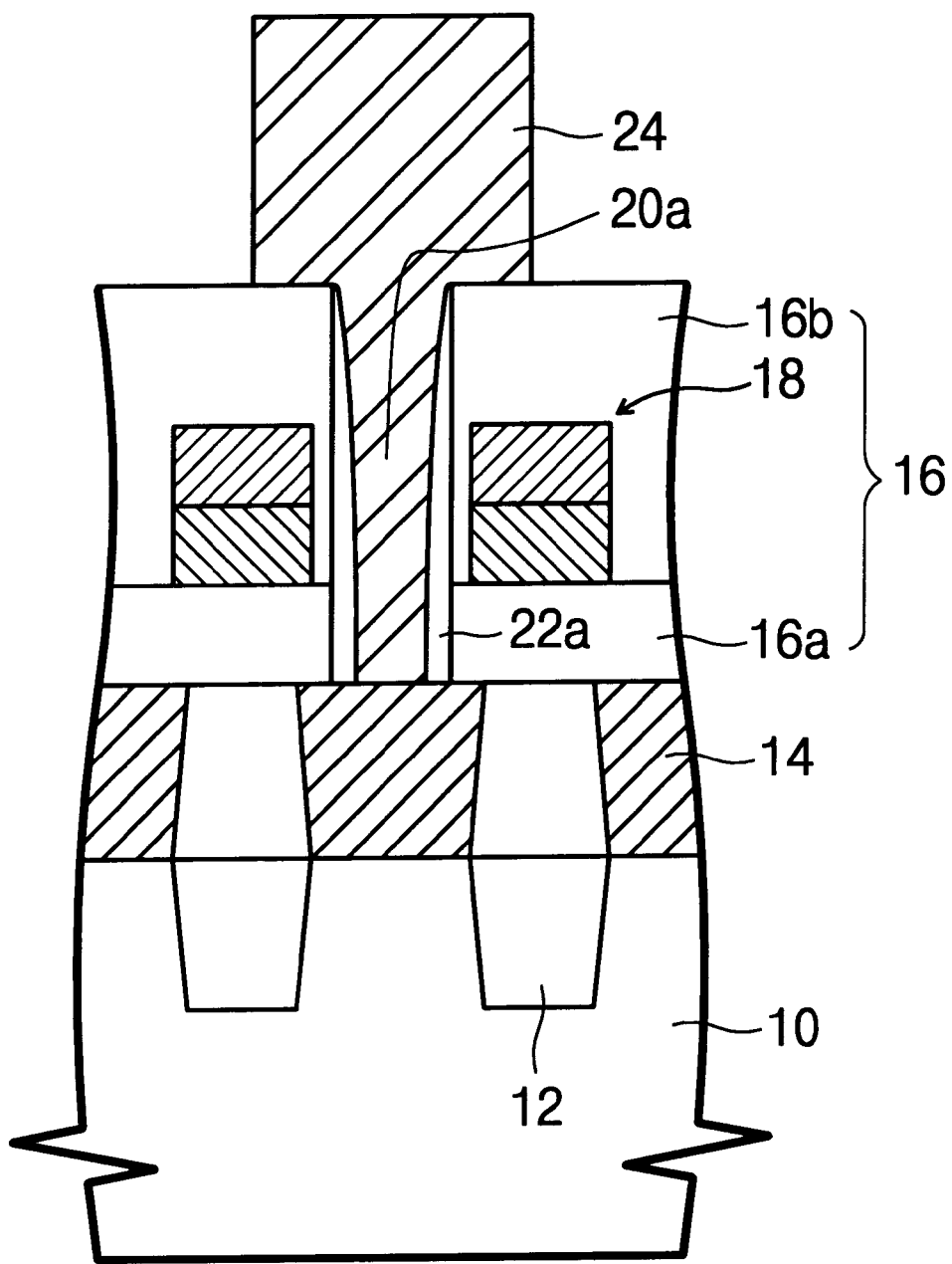
FIG. 1 is a cross-sectional view illustrating an ideal storage node contact hole for a semiconductor memory device according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of the layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 4A:
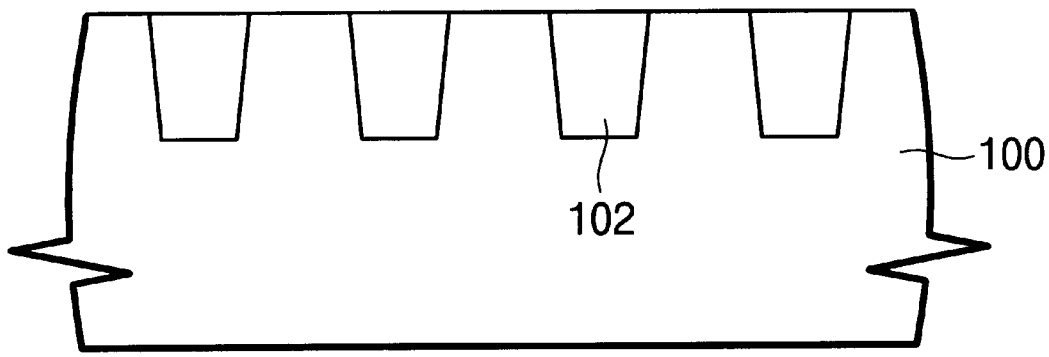
FIGS. 4A to 4E are cross-sectional views illustrating steps of a method for forming a storage node contact of a semiconductor memory device according to the present invention.
Figure 4B:
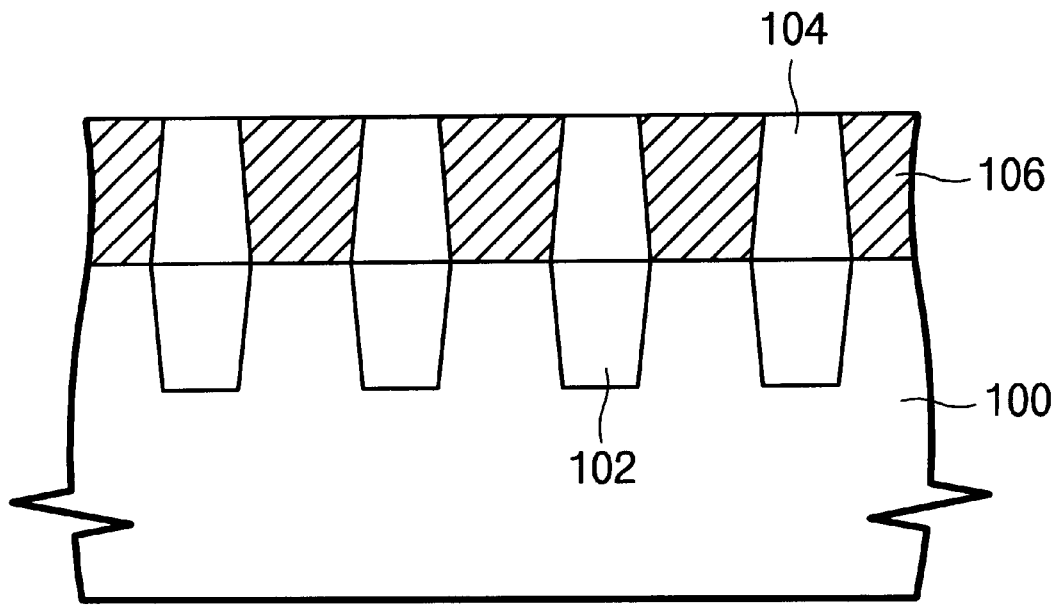
Figure 4C:
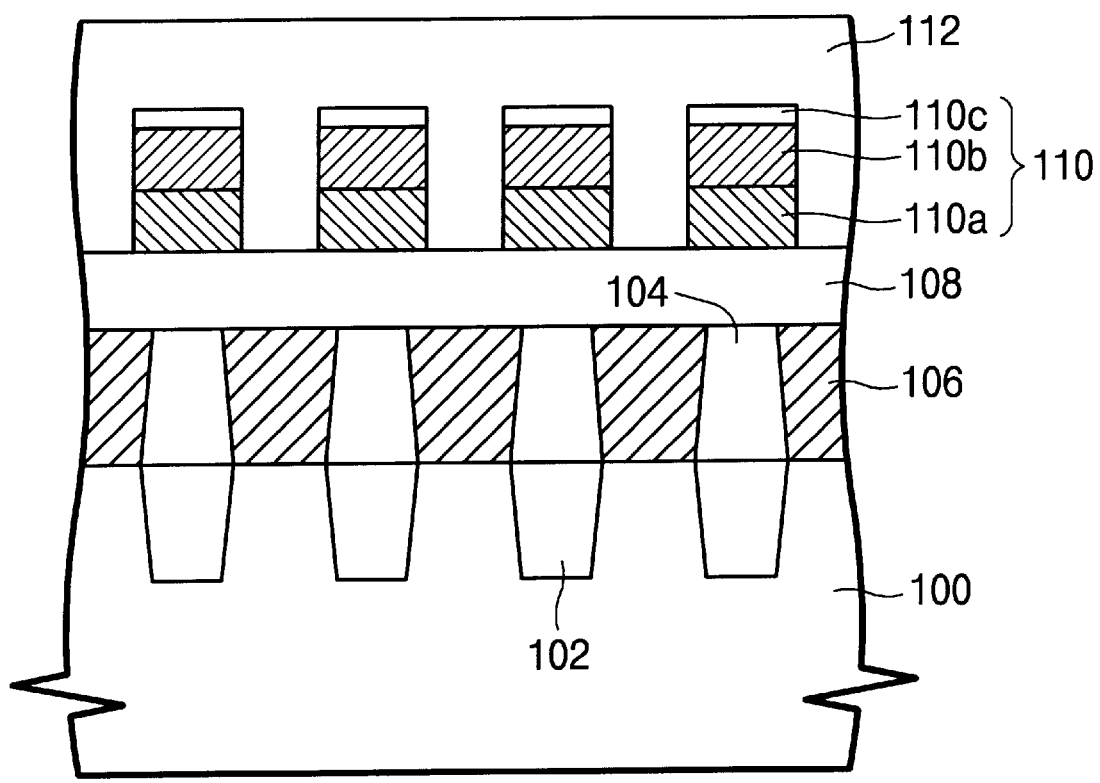
Figure 4D:
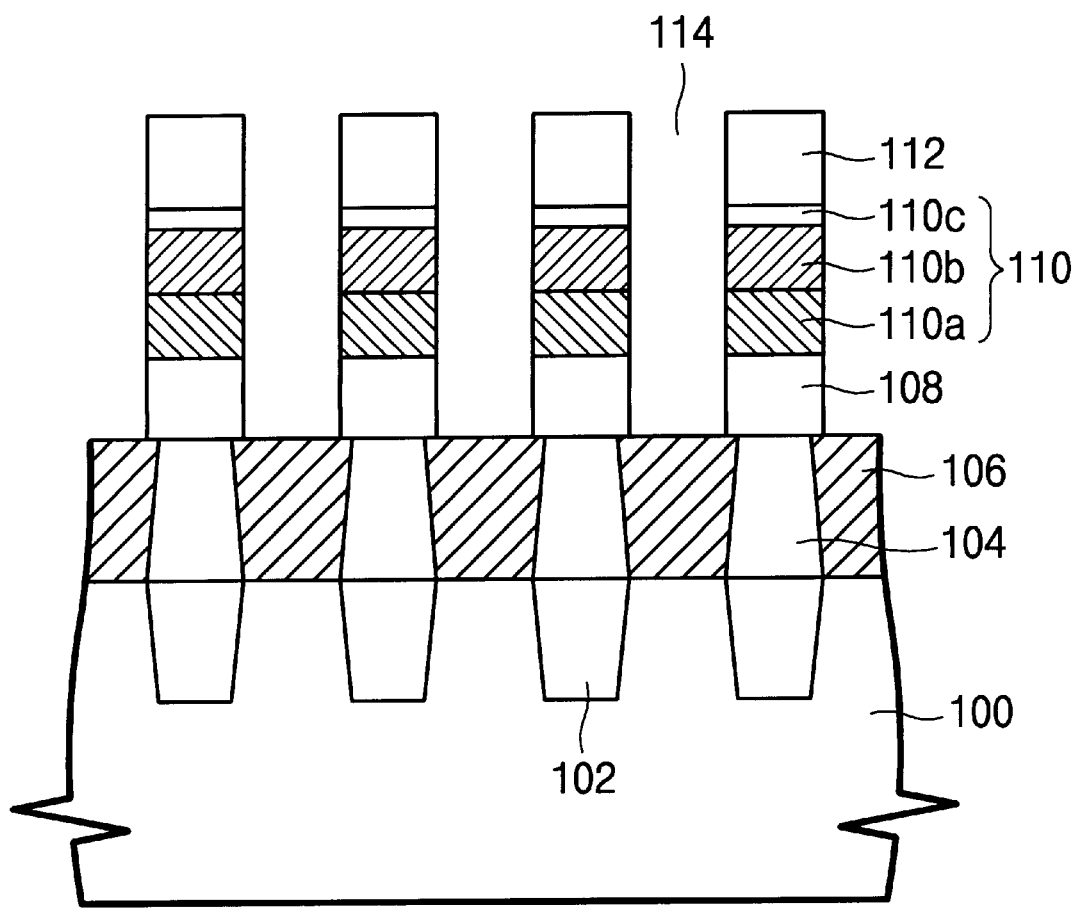

Referring to FIG. 4D, a contact pad 106 is formed on a semiconductor substrate 100. A first insulating layer 108 is then formed on the semiconductor substrate 100 including the contact pad 106. A bit line 110 is then formed on the first insulating layer 108. A second insulating layer 112 is then formed on the first insulating layer 108 including the bit line 110. The second and first insulating layers 112 and 108 are etched to expose a portion of the contact pad 106, to form a storage node contact hole 114. Exposed sidewall portions of the bit line 110 and the first insulating layer 108 underneath the bit line 110 are etched. An insulating spacer 116 is formed on sidewalls of the storage node contact hole 114. In accordance with the method of fabricating such a semiconductor memory device, the exposed portion of the bit line 110 and the insulating layer 108 are etched so as to improve the profile of the contact hole 114 when forming the storage node contact hole 114 and to reduce the occurrence of short-circuits between the bit lines 110 and the storage nodes 118.

Hereinafter, embodiments of the present invention will be discussed with reference to FIGS. 4A to 4E. FIGS. 4A to 4E are cross-sectional views illustrating steps for forming a storage node contact of the semiconductor memory device according to the present invention.

Referring to FIG. 4A, a device isolation layer 102 is formed on a semiconductor substrate 100, thereby defining an active region and an inactive region. The device isolation layer 102 can be formed using a shallow trench isolation technique.

In FIG. 4B, the contact pads 106 are formed on some portions of the semiconductor substrate 100 between the device isolation layers 102 to electrically connect the portions of the semiconductor substrate to a first capacitor electrode to be formed at a later step. The contact pads can be formed from a conductive layer such as a polysilicon layer. The contact pads 106 can be formed using a SAC (Self-Aligned Contact) technique. In other words, the insulating layer 104 is formed on the semiconductor substrate 100, and the insulating layer 104 is then etched to form contact holes exposing the semiconductor substrate 100 between the device isolation layers 102. The contact holes are then filled with the conductive layer, such as a polysilicon layer, to form the contact pads 106.

Referring to FIG. 4C, a first insulating layer 108 is formed on a semiconductor substrate 100 including the contact pads 106 and the insulating layer 104. Bit lines 110 are formed on the first insulating layer 108. The bit lines 110 can be formed as a multi-layer laminate including a polysilicon layer 110a, a tungsten silicide layer 110b, and an ARC (Anti-Reflective Coating) layer 110c. A second insulating layer 112 is formed on the first insulating layer 108 and on the bit lines 110.

Figure 2:
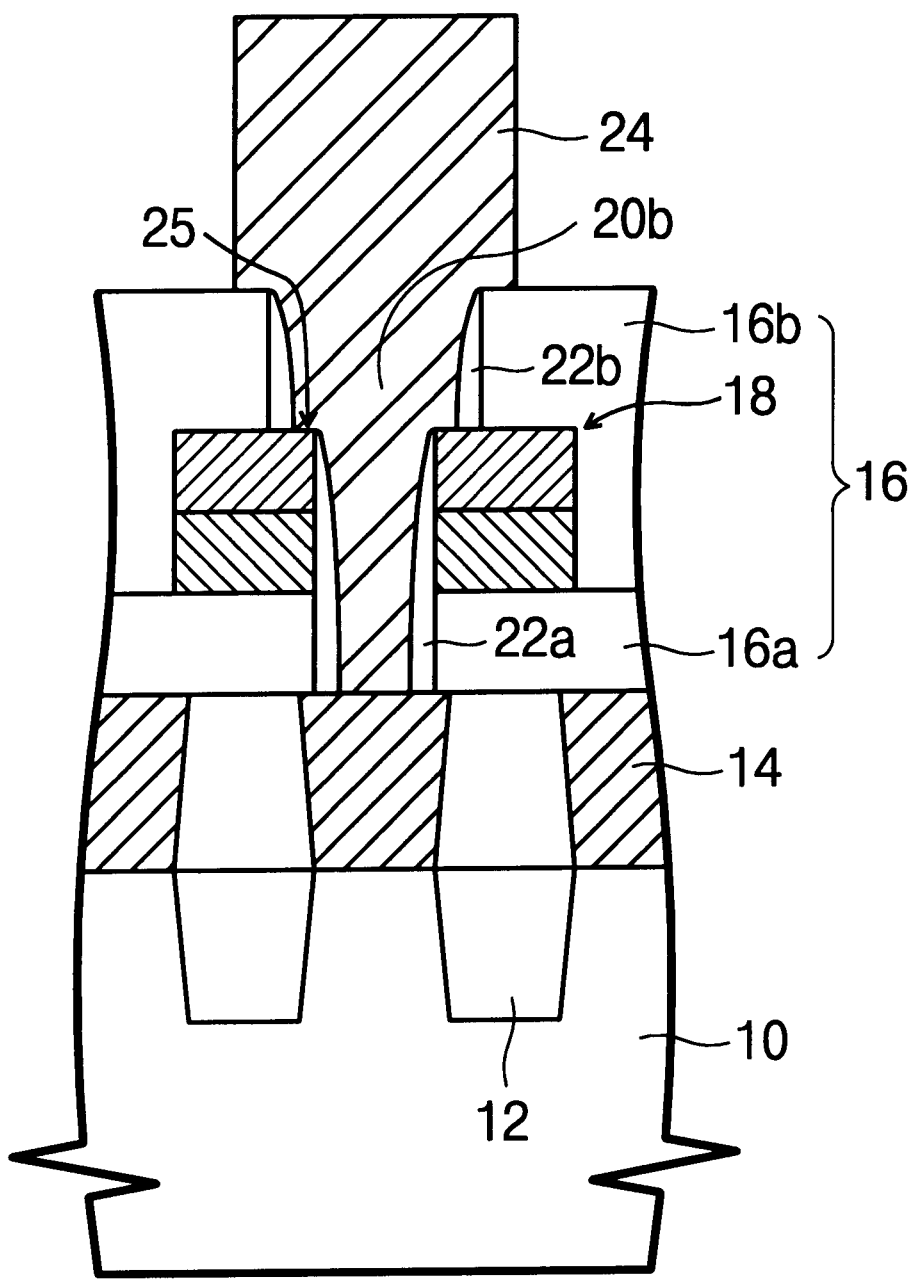
FIGS. 2 and 3 are cross-sectional views illustrating storage node contact holes for semiconductor memory devices according to the prior art.
Figure 3:
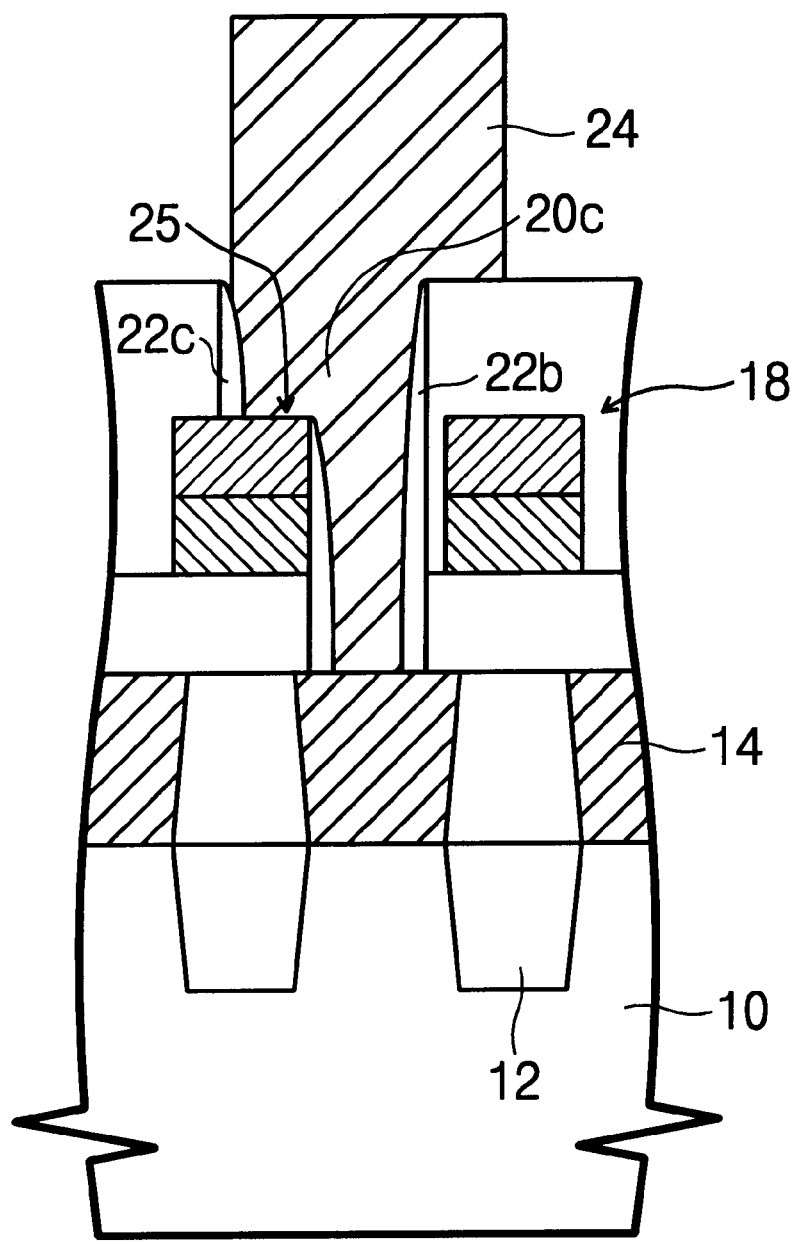

In FIG. 4D, the second and first insulating layers 112 and 108 are etched to expose portions of the contact pads 106, thus forming storage node contact holes 114. Each storage node contact hole 114 can have a size in the range of 0.1–0.25 μm. As illustrated in FIGS. 2 and 3, however, portions of the bit lines 110 may be exposed if the size of the storage node contact holes increases due to overexposure or overetching during contact hole formation. Portions of the bit lines may also be exposed as a result of misalignment. In other words, surface portions and sidewalls of the bit lines may be exposed in the contact hole so that a step or projection is formed in the contact hole as shown in FIGS. 2 and 3. Accordingly, a separate step of etching the exposed portions of the bit lines 110 and the first insulating layer 108 can be performed before a subsequent step of forming insulating spacers 116. In particular, an isotropic etch (such as a dry etch) can be used to remove exposed portions of the bit line and the first insulating layer 108 there beneath to provide the contact holes 114 having smooth profiles shown in FIG. 4D.

Figure 4E:
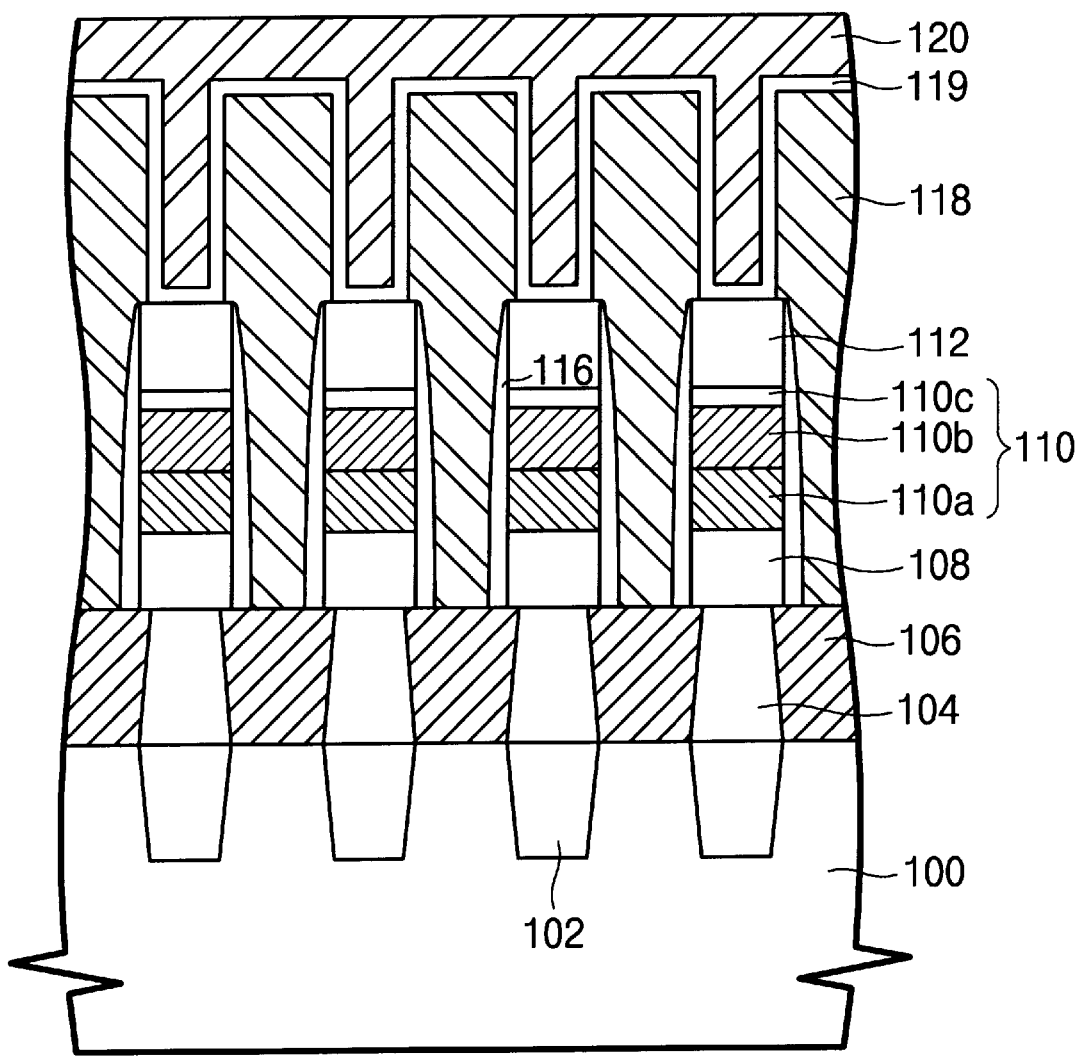

Finally, the spacers 116 are formed on sidewalls of the storage node contact holes 114 using an insulating layer such as an oxide layer or a nitride layer, as shown in FIG. 4E. Because exposed portions of the bit lines 110 and the first insulating layer 108 were etched, the insulating spacers 116 can provide sufficient insulation between the bit lines 110 and the storage nodes 118 (formed by a subsequent step) so that short-circuits therebetween can be reduced. More particularly, the spacers 116 can be formed from an insulating material such as a high temperature oxide (HTO) or silicon nitride (SiN).

If the bit lines 110 include an ARC layer, the ARC layer can be a silicon nitride layer or a silicon oxynitride (SiON) layer, and when the ARC layer 110c is formed on the tungsten silicide layer 110b, an excessive silicon layer may form at an interface therebetween. Such an excessive silicon layer may react with oxygen ($O_2$) to form further projections within the storage node contact holes 114 at the stage of forming the insulating spacers 116. Such projections may reduce the width of the storage node contact holes 114. In order to reduce the projections, a step of annealing at a temperature in the range of 400 to 800° C. can be performed before forming the insulating spacers 116, thereby reducing the excessive silicon layer.

A conductive layer such as a polysilicon layer is formed over the semiconductor substrate 100 including the first insulating layer 108, the bit lines 110, the second insulating layer 112, the spacers 116, and the storage node contact holes 114. This conductive layer is patterned to form storage nodes 118. A capacitor dielectric layer 119 and a plate electrode 120 are sequentially formed on the second insulating layer 112 and the storage nodes 118 to complete the semiconductor memory device as illustrated in FIG. 4E.

The above described method for forming a semiconductor memory device according to an embodiment of the present invention can be generally applied to processes for forming contact holes by etching multi-insulating layers having conductive layers therebetween. In accordance with the method of the present invention, an exposed portion of the bit lines and the insulating layer are etched to improve the profile of the contact holes when forming the storage node contacts, thereby reducing the occurrence of short-circuits between the bit lines and the storage nodes.

In the drawings and specification, there have been disclosed typical preferred embodiments of the invention, and although specific terms are employed, they are used in a generic sense only and not for the purposes of limitation, the scope of the invention being set forth in the following claims.

That which is claimed is:

1. A method for forming an electronic device, the method comprising the steps of:
    forming a first insulating layer on a substrate;
    forming a patterned conductive layer on the first insulating layer;
    forming a second insulating layer on the first insulating layer and on the patterned conductive layer;
    after forming the first and second insulating layers and the patterned conductive layer, forming a contact hole through the first and second insulating layers exposing a portion of the substrate and a portion of the patterned conductive layer so that sidewalls of the contact hole including the exposed portion of the patterned conductive layer have a smooth profile through the first and second insulating layers; and
    forming an insulating spacer on the contact hole sidewalls having the smooth profile.

2. A method according to claim 1 wherein the step of forming the patterned conducive layer comprises forming a polysilicon layer on the first insulating layer.

3. A method according to claim 2 wherein the step of forming the patterned conductive layer further comprises forming a tungsten silicide layer on the polysilicon layer.

4. A method according to claim 3 wherein the step of forming the patterned conductive layer further comprises forming an anti-reflective coating (ARC) layer on the tungsten silicide layer.

5. A method according to claim 4 wherein the step of forming the insulating spacer is preceded by the step of:
    annealing the first and second insulating layers and the patterned conductive layer at a temperature in the range of 400 degrees C to 800 degrees C.

6. A method according to claim 4 wherein the anti-reflective coating (ARC) layer comprises a material selected from the group consisting of silicon nitride (SiN) and silicon oxynitride (SiON).

7. A method according to claim 6 wherein the step of forming the insulating spacer is preceded by the step of:
    annealing the first and second insulating layers and the patterned conductive layer at a temperature in the range of 400 degrees C. to 800 degrees C.

8. A method according to claim 1 wherein the patterned conductive layer comprises a bit line and wherein the step of forming the insulating spacer is followed by the steps of:
    forming a conductive via in the contact hole;
    forming a first capacitor electrode on the conductive via opposite the substrate;
    forming a capacitor dielectric layer on the first capacitor electrode opposite the substrate; and
    forming a second capacitor electrode on the capacitor dielectric layer opposite the first capacitor electrode.

9. A method according to claim 8 wherein the conductive via comprises polysilicon.

10. A method according to claim 1 wherein the substrate comprises a contact pad, and wherein the contact hole exposes a portion of the contact pad.

11. A method according to claim 1 wherein the step of forming the insulating spacer is preceded by the step of:
    annealing the first and second insulating layers and the patterned conductive layer at a temperature in the range of 400 degrees C. to 800 degrees C.

12. A method according to claim 1 wherein the insulating spacer comprises a material selected from the group consisting of a high temperature oxide (HTO) layer and a silicon nitride (SiN) layer.

13. A method according to claim 1 wherein the step of forming the contact hole comprises:
    forming a preliminary contact hole through the first and second insulating layers wherein a surface portion of the patterned conductive layer opposite the substrate and a sidewall of the patterned conductive layer are exposed by the preliminary contact hole so that a step is formed in a sidewall of the preliminary contact hole; and
    etching the exposed portions of the patterned conductive layer to reduce the step thereby providing the contact hole sidewalls having the smooth profile.

14. A method for forming a semiconductor memory device comprising the steps of:
    forming a contact pad on a semiconductor substrate;
    forming a first insulating layer on the semiconductor substrate on the contact pad;
    forming a bit line on the first insulating layer;
    forming a second insulating layer on the first insulating layer and on the bit line;
    after forming the first and second insulating layers and the bit line, forming a storage node contact hole through the second and first insulating layers to expose a portion of the contact pad and to expose a portion of the bit line;
    after forming the storage node contact hole, etching the exposed portions of the bit line and the first insulating layer so that sidewalls of the contact hole including the exposed portion of the bit line have a smooth profile; and
    forming an insulating spacer on sidewalls of the storage node contact hole.

15. A method according to claim 14 wherein the step of forming the insulating spacer is preceded by the step of:
    annealing the first and second insulating layers and the bit line at a temperature in the range of 400 degrees C. to 800 degrees C.

16. A method according to claim 14 wherein the insulating spacer comprises a material selected from the group consisting of a high temperature oxide (HTO) layer and a silicon nitride (SiN) layer.

17. A method for forming a semiconductor memory device comprising the steps of:
    forming a first insulating layer on a semiconductor substrate;
    forming a conductive layer pattern on the first insulating layer;
    forming a second insulating layer on the first insulating layer and on the conductive layer pattern;
    after forming the first and second insulating layers and the conductive layer pattern, forming a contact hole in the second and first insulating layers to expose a portion of the semiconductor substrate and a portion of the conductive layer pattern;
    after forming the contact hole, etching the exposed portion of the conductive layer pattern and the first insulating layer so that sidewalls of the contact hole including the exposed portion of the conductive layer pattern have a smooth profile; and
    forming an insulating spacer on sidewalls of the contact hole.

18. A method according to claim 17 wherein the step of forming the insulating spacer is preceded by the step of:
    annealing the first and second insulating layers and the conductive layer pattern at a temperature in the range of 400 degrees C. to 800 degrees C.

19. A method according to claim 17 wherein the insulating spacer comprises a material selected from the group consisting of a high temperature oxide (HTO) layer and a silicon nitride (SiN) layer.

20. A method according to claim 14 wherein a surface portion of the bit line opposite the substrate and a sidewall of the bit line are exposed by the storage node contact hole so that a step is formed in a sidewall of the storage node contact hole.

21. A method according to claim 17 wherein a surface portion of the conductive layer pattern opposite the substrate and a sidewall of the conductive layer pattern are exposed by the contact hole so that a step is formed in a sidewall of the contact hole.

22. A method according to claim 13 wherein etching the exposed portions of the patterned conductive layer comprises isotropically etching the exposed portions of the patterned conductive layer.

23. A method according to claim 14 wherein etching the exposed portions of the bit line comprises isotropically etching the exposed portions of the bit line.

24. A method according to claim 17 wherein etching the exposed portion of the conductive layer pattern comprises isotropically etching the exposed portion of the conductive layer pattern.

* * * * *